(12) United States Patent
Subbotin et al.

(10) Patent No.: US 9,182,451 B2
(45) Date of Patent: Nov. 10, 2015

(54) SYSTEM AND METHOD FOR POSTERIORI ADAPTATION OF A STATE OF CHARGE MODEL IN A BATTERY

(75) Inventors: Maksim Subbotin, San Carlos, CA (US); Ashish Samuel Krupadanam, Cupertino, CA (US); Nalin Chaturvedi, Sunnyvale, CA (US); Jasim Ahmed, Mountain View, CA (US)

(73) Assignee: Robert Bosch GmbH, Stuttgart (DE)

( * ) Notice: Subject to any disclaimer, the term of this patent is extended or adjusted under 35 U.S.C. 154(b) by 639 days.

(21) Appl. No.: 13/562,083

(22) Filed: Jul. 30, 2012

(65) Prior Publication Data

US 2014/0032141 A1 Jan. 30, 2014

(51) Int. Cl.
*G06F 19/00* (2011.01)
*G01R 31/36* (2006.01)
*H01M 10/42* (2006.01)
*H01M 10/48* (2006.01)

(52) U.S. Cl.
CPC ........... *G01R 31/3651* (2013.01); *H01M 10/42* (2013.01); *H01M 10/48* (2013.01); *H01M 2010/4271* (2013.01)

(58) Field of Classification Search
CPC .. G01R 31/3651; H01M 10/42; H01M 10/48; H01M 2010/4271; H01M 31/3631; H01M 31/3648; H01M 31/3668; H01M 31/3675; H02J 2007/005; H02J 7/0047
USPC ................... 702/63, 118; 320/106, 132, 162; 324/427; 703/13
See application file for complete search history.

(56) References Cited

U.S. PATENT DOCUMENTS

| | | | |
|---|---|---|---|
| 4,949,046 A | 8/1990 | Seyfang | |
| 5,349,540 A | 9/1994 | Birkle et al. | |
| 6,011,379 A | 1/2000 | Singh et al. | |
| 6,307,351 B1 * | 10/2001 | Yokoyama | 320/132 |

(Continued)

FOREIGN PATENT DOCUMENTS

| | | |
|---|---|---|
| DE | 102011116970 A1 | 5/2012 |
| EP | 1100171 A2 | 5/2001 |

(Continued)

OTHER PUBLICATIONS

Jiang et al, "Error correct of Kalman Algorithm on SOC Estimation in PEV," International Journal of Renewable Energy Vehicles, 2010, pp. 1-5, © www.greenenergy.net.nz, Peoples Republic of China (5 pages).

(Continued)

*Primary Examiner* — John H Le
(74) *Attorney, Agent, or Firm* — Maginot Moore & Beck LLP

(57) ABSTRACT

A method for estimating a state of charge in a battery includes identifying a first state of charge in the battery at a first time, identifying the first state of charge in the battery at a second time after operation of the battery, identifying an estimated state of charge at the second time with reference to a model having a plurality of model parameters, modifying at least one of the plurality of model parameters with reference to an error between the estimated state of charge and the first state of charge, and generating an output corresponding to an estimate of the state of charge of the battery using the model with the at least one modified parameter while operating the battery in the at least one operating mode after the second time.

21 Claims, 3 Drawing Sheets

(56) References Cited

U.S. PATENT DOCUMENTS

| | | | |
|---|---|---|---|
| 6,534,954 | B1 | 3/2003 | Plett |
| 7,315,789 | B2 | 1/2008 | Plett |
| 7,521,895 | B2 * | 4/2009 | Plett .............................. 320/132 |
| 2011/0031938 | A1 | 2/2011 | Ishikawa |
| 2012/0109617 | A1 * | 5/2012 | Minarcin et al. ................ 703/14 |

FOREIGN PATENT DOCUMENTS

| | | |
|---|---|---|
| EP | 1231475 A2 | 8/2002 |
| WO | 2007100189 A1 | 9/2007 |
| WO | 2011060820 A1 | 5/2011 |

OTHER PUBLICATIONS

Malinowski, "State of Charge Estimation for Advanced Batteries: Reduced Order Electrochemical Modeling with Error Compensation," Thesis submitted to Auburn University, Dec. 2011, pp. 1-156, USA (156 pages).

Pop et al, "State-of-the-art of battery state-of-charge determination," Measurement Science and Technology, 2005, pp. R93-R110, vol. 16, IOP Publishing Ltd, The Netherlands (8 pages).

Pop et al, "Battery Aging and Its Influence on the Electromotive Force," Journal of the Electrochemical Society, 2007, pp. A744-A750, vol. 154, No. 8, ECS, The Netherlands (7 pages).

Pop et al., "Accuracy analysis of the State-of-Charge and remaining run-time determination for lithium-ion batteries," Measurement, 2009, pp. 1131-1138, vol. 42, Elsevier, The Netherlands (8 pages).

Shariari, "Online State-of-Health Estimation of VRLA Batteries Using State of Charge," IEEE Industrial Electrical Society, 2012, pp. 1-19, ISSN: 0278-0046, Iran (19 pages).

Zhang et al., "A review of prognostics and health monitoring of Li-ion battery," Journal of Power Sources, 2011, pp. 6007-6014, vol. 196, Elsevier, USA (8 pages).

International Search Report and Written Opinion in corresponding International Application (i.e., PCT/US2013/052722), mailed Nov. 15, 2013 (13 pages).

Lee et al., "Intelligent Control of Electric Scooters," Research Paper, Institute of Information Science, Taiwan, Available prior to Jul. 30, 2011 (7 pages).

Plett, Kalmal-Filter SOC Estimation for LiPB HEV Cells, Available prior to Jul. 30, 2011, 12 pages.

Scott et al., "Robust Lead-Acid Battery State-of-Charge Meter Designed for Simple Field Installation," Research Paper, Department of Engineering, University of Waikato, undated, pp. 1-6, IEEE, New Zealand, Available prior to Jul. 30, 2011 (6 pages).

* cited by examiner

SYSTEM AND METHOD FOR POSTERIORI ADAPTATION OF A STATE OF CHARGE MODEL IN A BATTERY

FIELD

This document relates generally to systems and methods for monitoring the operation of a battery and, more particularly, to adaptation of parameters in models that are used to estimate the state of charge in batteries.

BACKGROUND

A wide range of rechargeable batteries is known that can supply an electrical current to drive a load during a discharge process and that can receive electrical current from a charging device to recharge the battery. Examples of rechargeable batteries include, but are not limited to, metal-ion, metal-oxygen, lead acid, rechargeable alkaline, flow batteries, and the like. Examples of metal-ion and metal-oxygen batteries include lithium-ion and lithium-oxygen (sometimes referred to as lithium-air) batteries.

A flow battery is a form of rechargeable battery in which electrolyte containing one or more dissolved electroactive species flows through an electrochemical cell that converts chemical energy directly to electricity. The electrolyte is stored externally, generally in tanks, and is pumped through the cell (or cells) of the reactor. Control of flow batteries requires knowledge of the flow rate and State of Charge (SOC) of the battery. Together these two factors determine the concentration and availability of reactants at the electrodes and the current that can be drawn from the cell for the best efficiency within predetermined operating limits. The SOC is also used to determine how much energy the battery can store or deliver. This variable can be used to plan the usage of the battery in a device or within a power supply system. The identified SOC may also determine the power that the battery can produce at any given time during discharge process.

Many applications that use batteries to supply electrical power benefit from an accurate knowledge of the SOC within the battery during operation. For example, in flow batteries, such as Zinc-Bromine batteries, external or internal sensing devices can detect when the battery is either completely discharged or fully charged with reasonable accuracy. During operation, however, the battery is typically in an intermediate state between being fully charged and fully discharged. Additionally, the battery can be receiving charge or supplying current at different times during operation. Battery sensors, such as current and voltage sensors, do not provide complete information about the battery SOC and analytical or experimentally developed models are often used to compute SOC. Different models are used based on the physical and electrochemical characteristics for a large population of batteries that share a common design. While the models can provide fairly accurate estimates of SOC in a battery that conforms to the predetermined model, an individual battery often deviates from the model due to variations in materials and manufacturing tolerances, environmental conditions in which the battery operates, and physical and electrochemical changes that occur in the battery over the course of multiple charge and discharge cycles. Thus, utilization of fixed models for estimating SOC has drawbacks and requires improvements.

In light of the foregoing limitations in the art, a need exists for improved systems and methods for estimating the SOC in individual batteries. Additionally, improved methods of estimating SOC that are applicable to multiple forms of battery, including metal-ion, metal-air, and flow batteries, would be beneficial.

SUMMARY

In one embodiment, a method of estimating a state of charge of a battery has been developed. The method includes identifying a first state of charge in the battery at a first time, identifying the first state of charge in the battery at a second time after the battery operates in at least one operating mode with a plurality of states of charge in the battery other than the first state of charge, identifying an estimated state of charge at the second time with reference to a model having a plurality of model parameters stored in a memory corresponding to the first state of charge at the first time, the second time being later than the first time, identifying an error between the first state of charge and the estimated state of charge of the battery, modifying at least one of the plurality of model parameters with reference to the identified error, and generating an output corresponding to an estimate of the state of charge of the battery using the model with the at least one modified parameter while the battery operates in the at least one operating mode after the second time.

In another embodiment, a system for estimating a state of charge in a battery has been developed. The system includes a sensor operatively connected to a battery and configured to measure at least one of an input current, input voltage, output current, and output voltage from the battery, a memory configured to store programmed instructions and a plurality of model parameters associated with the battery, an output device configured to generate an output corresponding to an estimated state of charge in the battery, and a processor operatively connected to the sensor, the memory, and the output device. The processor is configured to identify a first state of charge in the battery at a first time with reference to a first signal from the sensor, identify the first state of charge in the battery at a second time with reference to a second signal from the sensor after the battery operates in at least one operating mode with a plurality of states of charge in the battery other than the first state of charge, the second time being later than the first time, identify an estimated state of charge at the second time with reference to a model having the plurality of model parameters corresponding to the battery in the first state of charge at the first time, identify an error between the first state of charge and the estimated state of charge of the battery, modify at least one of the plurality of model parameters with reference to the identified error, and generate, with the output device, an output corresponding to an estimate of the state of charge of the battery using the model with the at least one modified parameter while the battery operates in the at least one operating mode after the second time.

DESCRIPTION

Figure 1:
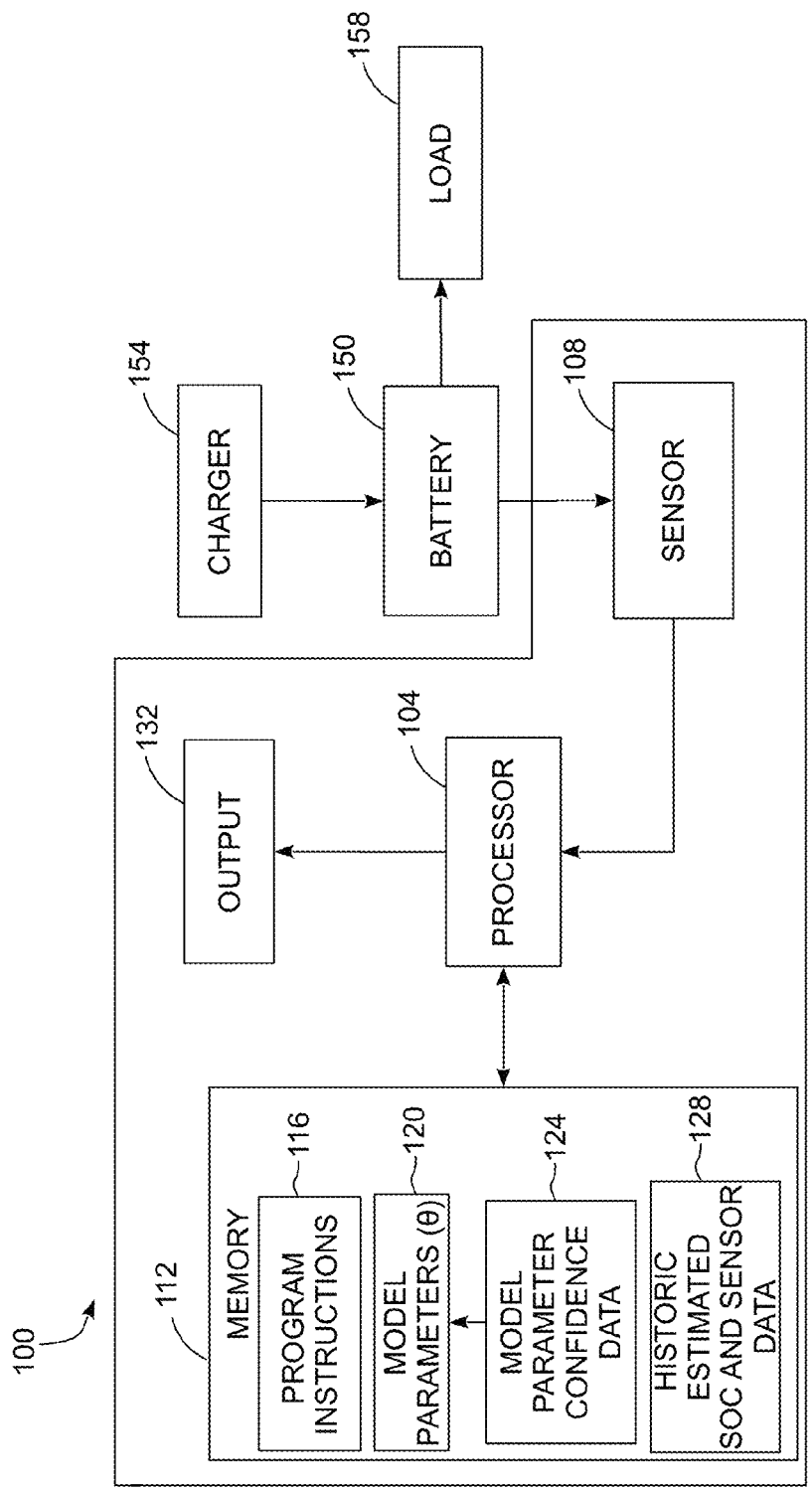
FIG. 1 is a schematic diagram of a battery monitoring system that is configured to monitor a state of charge in a battery.

For the purposes of promoting an understanding of the principles of the embodiments described below, reference is made to the exemplary embodiments depicted in the drawings and described in the following written specification. No limitation to the scope of the patent is intended by these depictions and descriptions. The scope of the patent includes any alterations and modifications to the illustrated embodiments and includes further applications of the principles of the embodiments as would normally occur to one skilled in the art to which this patent pertains.

FIG. 1 depicts a battery monitoring system (BMS) 100. The BMS 100 includes a digital processor 104, battery sensor 108, memory 112, and an output device 132. The BMS 100 is connected to a battery 150 to enable the sensor 108 to monitor the battery 150.

The sensor 108 is configured to measure a current and voltage level of an electrical input current that is supplied to the battery 150 from a charger 154 during a charging operation, and to measure a current and voltage level of an electrical output current that the battery 150 supplies to an electrical load 158 during a discharge operation. An analog to digital (A/D) converter in the sensor 108 or an external A/D converter generates digital data corresponding to the output of the sensor 108 for use with the processor 104.

The BMS 100 can optionally include additional sensors such as a temperature sensor to monitor a temperature of the battery 150 during operation. If the battery 150 is a flow battery, the sensor 108 can include a flow sensor to measure a rate of flow of an electrolyte in battery 150. If the battery 150 is a metal-oxygen battery that exchanges oxygen with the surrounding atmosphere or an oxygen supply, then the sensor 108 can detect flow of oxygen into and out of the battery 150.

The digital processor 104 is a microprocessor or other digital logic device that is configured to receive sensor data from the sensor 108, to read and write data from the memory 112, and to generate output signals for the output device 132. The memory 112 includes one or more digital data storage devices including non-volatile data storage devices, such as magnetic or optical disks, solid-state memory, and the like, as well as volatile memory such as static or dynamic random access memory (RAM).

During operation, the digital processor 104 executes program instructions 116 that are stored in the memory 112 to generate estimates for the SOC of the battery 150. The processor 104 utilizes a model of the battery 150 with a plurality of model parameters 120 that are stored in the memory 112 and generates estimates of the SOC in the battery 150 with reference to the model and data that are received from the sensor 108. The processor 104 can store a history of SOC estimates 128 in the memory 112, and generate output signals for the output device 132 to indicate the estimated SOC of the battery 150.

Battery models include any kind of map identified experimentally or developed based in physical principles that enable identification of battery SOC or other internal states from available measurements or previously computed variables. The model can be a static or dynamic model representing the internal state of the battery 150. Static models can be represented by a mathematical function mapping measurements to SOC and other battery states related to a plurality of model parameters. In another configuration, the static model includes a lookup table with a single or multiple dimensions that maps measurements to SOC and other battery states. An example of a static battery model includes a lookup table relating the battery terminal voltage and charge, discharge or idle state to the battery SOC.

Dynamic models can be represented by sets of ordinary differential equations or partial differential equations defined by a structure of the equations and a plurality of the model parameters mapping measurements and internal model states into SOC or other desired battery states. An example of dynamic battery model is a set of ordinary differential equations describing evolution of concentrations of electrochemical species and SOC in the battery as a function of applied current.

The processor 104 modifies the model parameters 120 during operation based on posterior data that are collected from the battery 150 when the battery 150 is in a predetermined charge state, such as being fully charged or fully discharged. The model parameters are modified using an optimization process implemented in the programmed software instructions 116.

In one configuration, the output device 132 includes one or more indicator lights, display devices such as LCD, dot matrix, and seven-segment displays, audible alarms, or other appropriate output devices that generate a human-perceptible output indicating the estimated SOC in the battery 150. In another configuration, the output device 132 includes a data transmission device, such as a wired or wireless network communication adapter, that sends the estimated SOC to an external automated monitoring or control system (not shown). For example, the output device 132 can transmit data via a control area network (CAN bus), serial connection, universal serial bus (USB), Inter-Integrated Circuit ($I^2C$) bus, wired or wireless local area network (LAN), wired or wireless wide area network (WAN), and the like. In one embodiment where the battery 150 is incorporated with a power grid or other electrical utility, the output device 132 can be configured to send data, including the estimated SOC of the battery 150, to a supervisory control and data acquisition (SCADA) device.

In one embodiment, the BMS 100 is separate from the battery 150 and is electrically connected to the battery 150 to monitor the SOC in the battery 150 during operation. In another embodiment, some or all of the components in the BMS 100 are integrated with the battery 150. The battery 150 can be a single cell in a larger battery array, or a battery pack that includes a plurality of cells that are electrically connected to each other.

Figure 2:
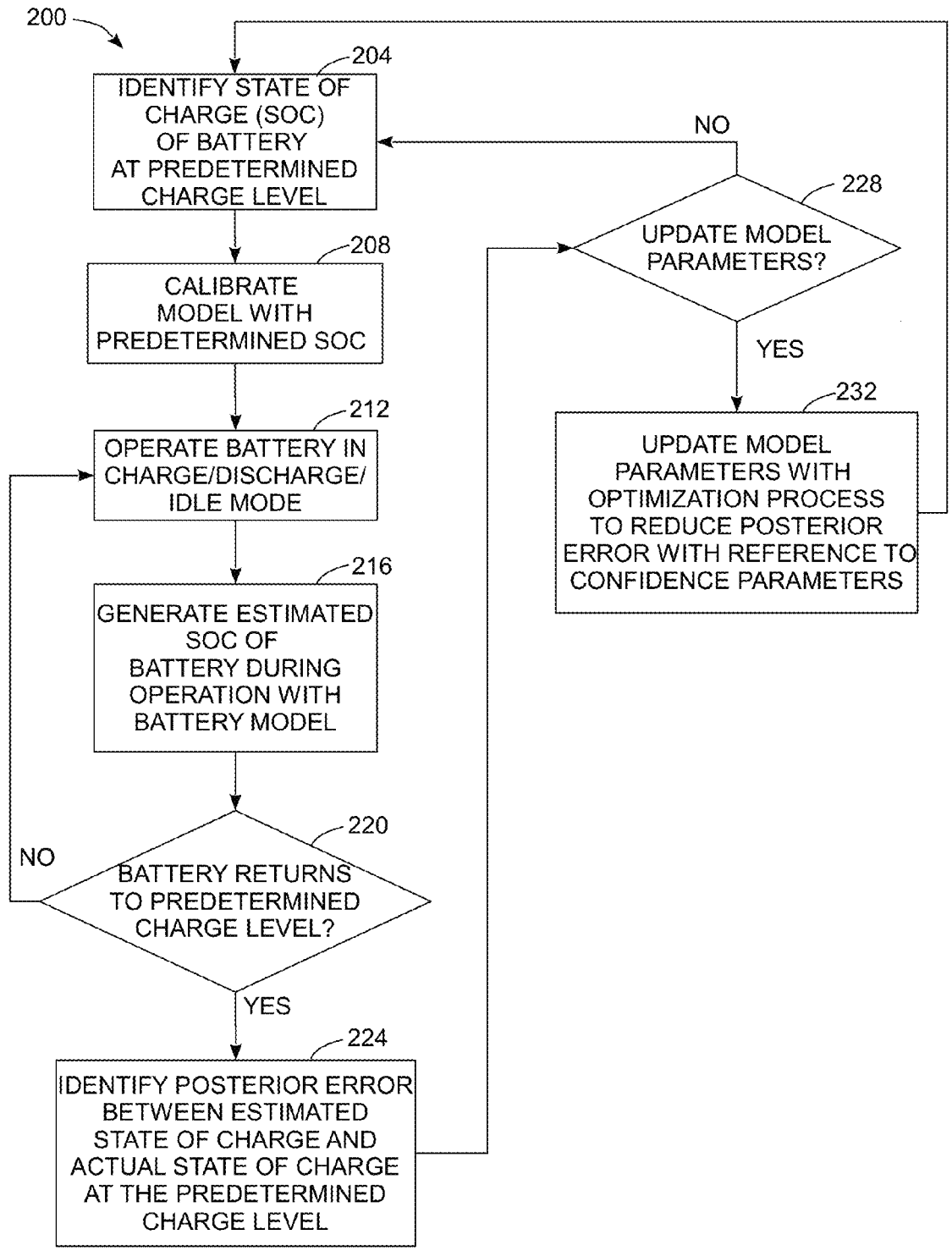
FIG. 2 is a block diagram of a process for estimating a state of charge in a battery.

FIG. 2 depicts a block diagram of a process 200 for updating a model of a battery in a battery monitoring system using posterior data to reduce or eliminate an error between an estimated SOC that is generated with the model and the actual SOC of the battery. In the discussion below, a reference to the process performing a function or action refers to a processor executing programmed instructions stored in a memory operatively connected to a processor to operate one or more components of a battery monitoring system to perform the function or action. The process 200 is described with reference to the battery monitoring system 100 for illustrative purposes.

Process 200 begins with identification of the state of charge (SOC) in a battery when the battery is at a predetermined charge level (block 204). For example, in a Zinc-Bromine flow battery with a deposition of Zinc on the battery electrodes, the battery discharges until reaching a zero SOC after performing a stripping cycle that removes the Zinc from the electrodes. As described above, however, the battery 150 normally operates in an intermediate SOC that is not directly measurable.

Figure 3:
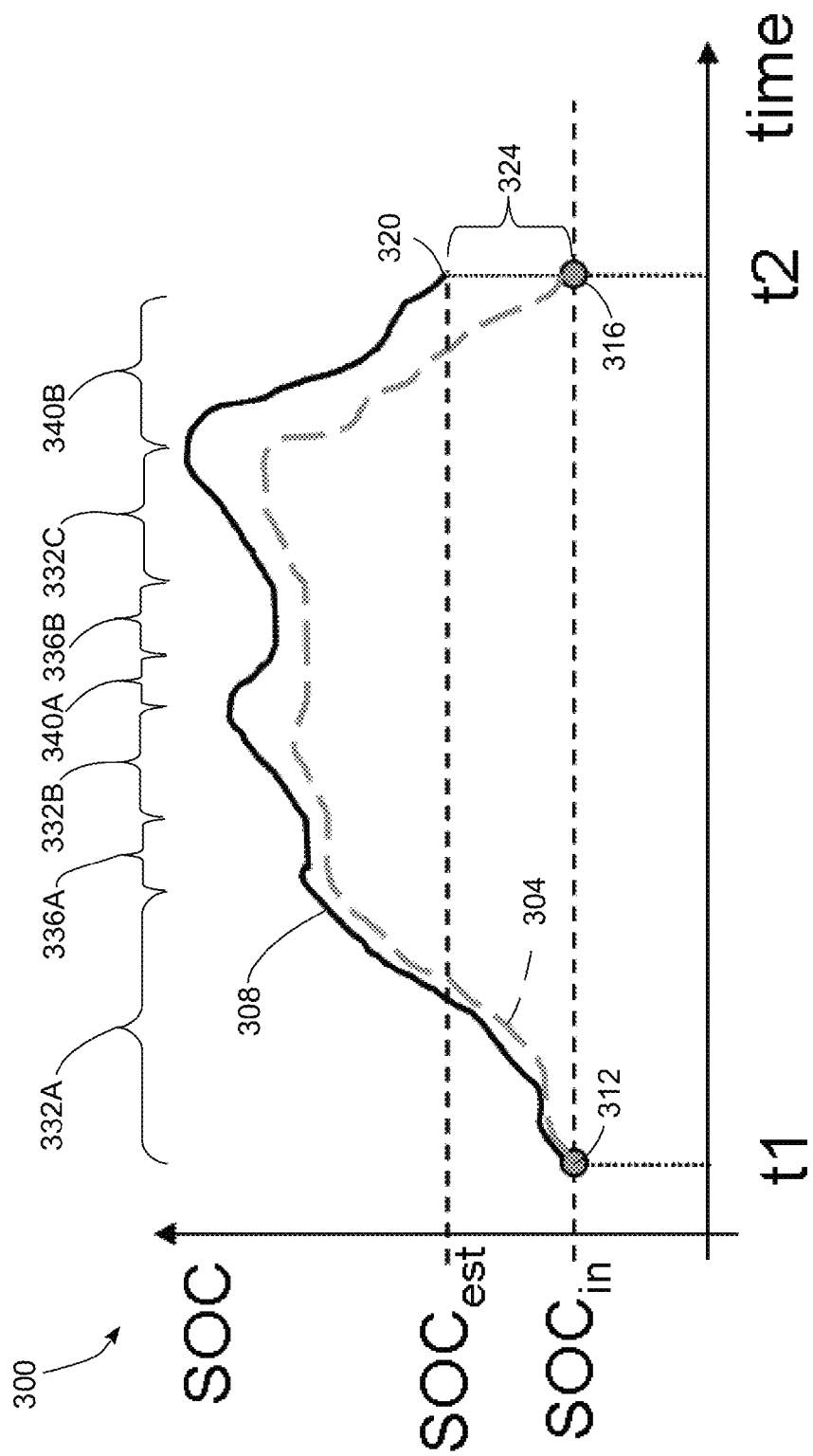
FIG. 3 is a graph depicting variations between an estimated state of charge for a battery and an actual state of charge in the battery over time.

When the battery 150 has reached the predetermined SOC, the processor 104 calibrates the model of the battery with the predetermined SOC (block 208). For example, FIG. 3 depicts a graph 300 of the SOC in a battery, such as the battery 150, over time for both the actual SOC 304 and an estimated SOC 308. At a first time t1 the battery 150 is in the predetermined SOC 312, such as being fully discharged in the example of graph 300. The model is calibrated with the same initial SOC 312 at time t1 that corresponds to the predetermined SOC of the battery.

Referring again to FIG. 2, process 200 continues as the battery 150 operates in charge, discharge, and idled modes (block 212). In FIG. 3, the SOC level increases during a charge mode that is depicted with references 332A, 332B, and 332C in the graph 300. The SOC remains substantially unchanged during an idle operating mode that is depicted with references 336A and 336B in the graph 300. The SOC drops during a discharge mode that is depicted with references 340A and 340B in the graph 300. As depicted in FIG. 3, the battery 150 can operate in the charge, discharge, and idle modes over a wide intermediate SOC range before the battery 150 returns to the discharged state 316 at a second time t2.

In the configuration of FIG. 1, the charger 154 generates electrical current to charge the battery 150 during operation. In a utility operating environment, the charger 154 can be a solar, wind, or other form of electrical generator that produces electricity on an intermittent basis to charge the battery 150. The load 158 can be a power grid that draws electrical power from the battery 154 on an intermittent basis to satisfy fluctuating power demand levels in the power grid. During an idle operating mode, the charger 154 does not provide additional electrical current to the battery 150, and the load 158 does not draw electrical current from the battery 150. The SOC in the battery 150 remains substantially constant over relatively short time intervals during the idle operating mode. As is known in the art, the SOC in the battery 150 can drop slowly due to leakage current in the idle operating mode.

Referring again to FIG. 2, the BMS 100 generates estimated SOC values for the battery using the battery model during operation (block 216). In one embodiment, the BMS 100 implements a static battery model. In the static model, the processor 104 generates an estimate of the SOC with the model $M_S$: $SOC=M_S(y, \theta)$ where y represents the measurements from the sensor 108 and $\theta$ represents the model parameters 120 from the memory 112. The static model $M_S$ is a multivariable function with a plurality of model parameters $\theta$. In the static model $M_S$, the SOC for the battery 150 at any given time t depends only upon the sensor data y at time t and upon the parameters $\theta$ of the static battery model. In another embodiment, the static model $M_S$ is represented by a lookup table where the parameters $\theta$ represent the table values.

In another embodiment, the BMS 100 implements a dynamic battery model $M_D$. The processor 104 generates an estimate of the SOC with the model $M_D$: $SOC=M_D(x, t, y, \theta)$, where x represents a battery state, t represents time, y represents the measurements from the sensor 108, and $\theta$ represents the model parameters 120 from the memory 112. In the dynamic model $M_D$, the estimated SOC of the battery 150 depends upon the estimated values of SOC at earlier times during operation in addition to the current measurement data from the sensor 108. The dynamic model is a set of ordinary or partial differential equations with parameters of the model defined by a set of parameters $\theta$ and measurements y acting as inputs to the equations. For both the static and dynamic battery models, the processor 104 can store a history of the estimated SOC values over time, and optionally measurement data from the sensor 108, as historic data 128 in the memory 112.

Process 200 continues as the battery 150 operates in the charge, discharge, and idle modes in a range of SOCs other than one of the predetermined SOC states (block 220). The BMS 100 continues to generate estimated values for the SOC of the battery 150 in a manner similar to the processing described above with reference to block 216. Eventually, the battery 150 returns to one of the predetermined SOC levels (block 220). For example, in FIG. 3, the battery returns to the discharged $SOC_{IN}$ level 316 at time t2. In FIG. 3, the estimated SOC graph 308 diverges from the actual SOC graph 304 over time. At time t2 the estimated SOC 320 diverges from the actual $SOC_{IN}$ 316 by an error value 324.

In process 200, the BMS 100 identifies the error (block 224), which can be expressed mathematically as $\Delta SOC = SOC_{IN} - SOC_{EST}(t2)$. The $SOC_{EST}$ value is the estimated SOC at time t2 using either the static model $M_S$ or dynamic model $M_D$. The error $\Delta SOC$ is referred to as a posterior error because the error $\Delta SOC$ is identified after operation of the battery 150 with actual changes in the SOC of the battery, and after the BMS 100 generates estimates of the SOC in the battery 150 during operation.

In the example of FIG. 2, a negative value of $\Delta SOC$ indicates that the model has overestimated the SOC for the battery 150, and a positive value of $\Delta SOC$ indicates that the model has underestimated the SOC for the battery 150. If the value of $\Delta SOC$ is zero, then there is no error between the $SOC_{EST}$ and the actual $SOC_{IN}$ at time t2, although there may be errors between the estimated $SOC_{EST}$ and actual SOC at other times during the operation of the battery 150.

During process 200, the BMS 100 can optionally update the model parameters $\theta$ 60 in response to the posterior SOC estimation error $\Delta SOC$ (block 228). If the magnitude of the posterior error $\Delta SOC$ is within an acceptable tolerance threshold, or if the BMS 100 requires additional posterior error measurements before modifying the model parameters $\theta$, then process 200 returns to perform the processing described above with reference to block 204.

If the BMS 100 determines that the model parameters should be updated (block 228), then the processor 104 applies an optimization process to the model parameters $\theta$ (block 232). The goal of the optimization process is to generate a new set of model parameters $\theta_{new}$ that produce a smaller magnitude of error $\Delta SOC_{new}$ when the model parameters $\theta_{new}$ are used with the model to produce an estimated $SOC_{NEW\_EST}$. Thus, the optimization process adapts the model parameters $\theta$ for the battery model to enable the battery modeling system to produce more accurate estimates of the SOC in the battery 150 based on the errors in the previously estimated SOC.

In process 200, the processor 104 adapts the model parameters $\theta_{new}$ with the optimization process so that if the model were to be used to generate the estimated SOC for the battery 150 using the $\theta_{new}$ parameters, then the final error $\Delta SOC_{new}$ at the time t2 depicted in the graph 300 would be smaller than the observed error 324 using the previous model parameters $\theta$. Various optimization techniques that are known to the art include, but not limited to Least-Squares methods and Interior-Point optimization techniques can be used to modify the model parameters $\theta$ to produce the new model parameters $\theta_{new}$.

One challenge to modifying the parameters $\theta$ during the optimization process is the existence of typically multiple parameters $\theta$ with multiple potential modifications to each of these parameters that produce a result of $\Delta SOC_{new}$ having a smaller error value. The optimization process may "over-fit" when modifying the model parameters $\theta$, which may result in parameters $\theta_{new}$ that are very accurate for the previously observed battery data, but are less accurate for future operations because the modifications are incorporating random noise and variations in the operation of the battery instead of long-term changes in the electrochemistry of the battery that affect the future operation of the battery. In the BMS 100, the memory 112 stores fixed confidence parameters 124 in association with each of the model parameters (θ) 120.

In one embodiment, the confidence parameters are numerical values on a scale of 0.0 to 1.0, where 0.0 indicates the lowest confidence and 1.0 indicates the highest confidence. The optimization process modifies each of the parameters θ based on an inverse of the confidence value. For example, a parameter $\theta_1$ with a comparatively low confidence value of 0.1 is modified by a larger amount than a parameter $\theta_2$ with a comparatively high confidence value of 0.9 during the optimization process.

The confidence values are determined empirically for different embodiments of the battery 150. For example, certain properties of the battery are determined to change by very small amounts over the operational lifetime of the battery, and model parameters corresponding to the more invariant properties are assigned high confidence values. Examples of model parameters with high confidence values include physical dimensions of the battery and its electrodes, surface areas, volumes, physical and electrochemical constants. Conversely, some properties of the battery vary by large margins during the lifetime of the battery and are assigned lower confidence values. Examples of parameters that may change significantly over a battery lifetime and hence have low confidence values include concentrations of chemical species at zero SOC and thickness of a reaction layer.

After the BMS 100 modifies the model parameters θ, process 200 performs the processing described above with reference to block 204. The BMS 100 continues to generate estimated SOC values for the battery 150 during operation. The processor 104 stores the modified model parameters $\theta_{new}$ in the model parameter memory 120 and uses the updated model parameters $\theta_{new}$ to generate estimated SOC values for the battery 150. Process 200 can be performed iteratively over the lifetime of the battery 150 to enable the BMS 100 to adapt to changes in the operating characteristics of the battery and generate accurate estimates of the SOC as the battery 150 ages during operation.

Process 200 can be utilized for various purposes during the operational life of the battery 150 battery. For example, the process 200 can be used to produce an initial calibration of a newly installed BMS and adapt the BMS to a new battery in order to minimize the discrepancies between the initial model of the battery SOC and the actual SOC due to inconsistencies in manufacturing process and resulting variations between the individual battery cells.

During normal operation of the BMS 100, process 200 can be used to adapt the model and compensate for battery aging and "wear and tear" of the battery system. By adapting each BMS to a particular battery, the overall performance of the battery storage installation can be improved since each individual BMS-battery pair performs more closely to an optimal point due to more accurate SOC estimation.

The identification of the error ΔSOC through the processing described above with reference to block 224 can be utilized for detection of a malfunctioning battery by the BMS 100. For example, if the magnitude of ΔSOC rapidly increases to a much larger value than is normally identified during process 200, then the processor 108 can generate an alarm using the output device 132 to alert operators or automated control systems to a potential fault in the battery 150.

It will be appreciated that various of the above-disclosed and other features, and functions, or alternatives thereof, may be desirably combined into many other different systems or applications. Various presently unforeseen or unanticipated alternatives, modifications, variations, or improvements therein may be subsequently made by those skilled in the art, which are also intended to be encompassed by the following claims.

We claim:

1. A method of estimating a state of charge of a battery comprising:
   measuring with a sensor at least one of an input current, input voltage, output current, and output voltage from the battery;
   identifying with a processor a first state of charge in the battery at a first time with reference to a first measurement signal from the sensor;
   identifying with the processor the first state of charge in the battery at a second time after the battery operates in at least one operating mode with a plurality of states of charge in the battery other than the first state of charge with reference to a second measurement signal from the sensor;
   identifying with the processor an estimated state of charge at the second time with reference to a model having a plurality of model parameters stored in a memory corresponding to the first state of charge at the first time, the second time being later than the first time;
   identifying with the processor an error between the first state of charge measured for the battery and the estimated state of charge of the battery;
   modifying with the processor at least one of the plurality of model parameters with reference to the identified error; and
   generating with an output device an output corresponding to an estimate of the state of charge of the battery using the model with the at least one modified parameter while the battery operates in the at least one operating mode after the second time.

2. The method of claim 1, the at least one operating mode including charge, discharge, and idle operating modes.

3. The method of claim 1 wherein the model is a static model.

4. The method of claim 3, the identification with reference to the static model further comprising:
   identifying with the processor a value corresponding to an estimated state of charge in a lookup table stored in the memory, the lookup table including a mapping between the plurality of model parameters and at least one of a measured input current, input voltage, output current, and output voltage from the battery.

5. The method of claim 3, the identification with reference to the static model further comprising:
   executing, with the processor, a plurality of instructions stored in the memory to identify the state of charge with reference to a mathematical function including the plurality of parameters and a value corresponding to at least one of a measured input current, input voltage, output current, and output voltage from the battery.

6. The method of claim 1 wherein the model is a dynamic model.

7. The method of claim 6, the identification with reference to the dynamic model further comprising:
   executing, with the processor, a plurality of instructions stored in the memory to identify the state of charge with reference to at least one differential equation of a relationship between a concentration of an electrochemical species in the battery and an electrical current applied to the battery.

8. The method of claim 1, the battery being in the first state of charge when the battery is in a fully discharged state.

9. The method of claim 1, the modifying of the at least one of the plurality of model parameters further comprising:
modifying with the processor a first model parameter and a second model parameter in the plurality of the model the parameters with reference to a first confidence parameter and a second confidence parameter, respectively.

10. The method of claim 9 further comprising:
applying with the processor a first modification to the first model parameter; and
applying with the processor a second modification to the second model parameter, the second modification being greater than the first modification, and the first confidence parameter being greater than the second confidence parameter.

11. A system for estimating a state of charge in a battery comprising:
a sensor operatively connected to a battery and configured to measure at least one of an input current, input voltage, output current, and output voltage from the battery;
a memory configured to store programmed instructions and a plurality of model parameters associated with the battery;
an output device configured to generate an output corresponding to an estimated state of charge in the battery; and
a processor operatively connected to the sensor, the memory, and the output device, the processor being configured to:
identify a first state of charge in the battery at a first time with reference to a first signal from the sensor;
identify the first state of charge in the battery at a second time with reference to a second signal from the sensor after the battery operates in at least one operating mode with a plurality of states of charge in the battery other than the first state of charge, the second time being later than the first time;
identify an estimated state of charge at the second time with reference to a model having the plurality of model parameters corresponding to the battery in the first state of charge at the first time;
identify an error between the first state of charge and the estimated state of charge of the battery;
modify at least one of the plurality of model parameters with reference to the identified error; and
generate, with the output device, an output corresponding to an estimate of the state of charge of the battery using the model with the at least one modified parameter while the battery operates in the at least one operating mode after the second time.

12. The system of claim 11, the at least one operating mode including charge, discharge, and idle operating modes.

13. The system of claim 11 wherein the model is a static model.

14. The method of claim 13, the static model further comprising: a lookup table stored in the memory including a mapping between a plurality of model parameters and at least one of a measured input current, input voltage, output current, and output voltage from the battery.

15. The method of claim 13, the static model further comprising: a plurality of instructions stored in the memory for execution by the processor to identify the state of charge with reference to a mathematical function including the plurality of parameters and a value corresponding to at least one of a measured input current, input voltage, output current, and output voltage from the battery.

16. The system of claim 11 wherein the model is a dynamic model.

17. The method of claim 16, the dynamic model further comprising:
a plurality of instructions stored in the memory for execution by the processor to identify the state of charge with reference to at least one differential equation of a relationship between a concentration of an electrochemical species in the battery and an electrical current applied to the battery.

18. The system of claim 11, the battery being in the first state of charge when the battery is in a fully discharged state.

19. The system of claim 11, further comprising:
a first confidence parameter stored in the memory in association with a first one of the plurality of model parameters;
a second confidence parameter stored in the memory in association with a second one of the plurality of model parameters; and
the processor being further configured to:
modify the first model parameter and the second model parameter with reference to the first confidence parameter and the second confidence parameter, respectively.

20. The system of claim 19, the processor being further configured to:
apply a first modification to the first model parameter; and
apply a second modification to the second model parameter, the second modification being greater than the first modification, and the first confidence parameter being greater than the second confidence parameter.

21. The system of claim 11 wherein the battery is a flow battery and the sensor is further configured to measure a rate of flow of an electrolyte in the flow battery.

* * * * *